United States Patent [19]

Tomita et al.

[11] 4,263,384

[45] Apr. 21, 1981

[54] METHOD OF FORMING FLUORESCENT SCREENS OF COLOR PICTURE TUBES

[75] Inventors: Yoshifumi Tomita; Masahiro Nishizawa, both of Mobara, Japan

[73] Assignee: Hitachi, Ltd., Tokyo, Japan

[21] Appl. No.: 77,939

[22] Filed: Sep. 24, 1979

[30] Foreign Application Priority Data

Sep. 29, 1978 [JP] Japan ................................ 53-119228

[51] Int. Cl.³ .............................................. G03C 5/00
[52] U.S. Cl. ........................................ 430/25; 430/29
[58] Field of Search ................... 430/25, 29, 306, 309, 430/324, 325, 313

[56] References Cited

U.S. PATENT DOCUMENTS

| | | | |
|---|---|---|---|
| 1,212,446 | 1/1917 | Boularan et al. | 430/306 |
| 2,310,223 | 2/1943 | Eaton et al. | 430/621 |
| 2,532,390 | 12/1950 | Bennett et al. | 430/309 |
| 3,317,319 | 5/1967 | Mayaud | 430/25 |
| 3,558,310 | 1/1971 | Mayaud | 430/25 |
| 3,632,339 | 1/1972 | Khan | 430/25 |
| 3,753,711 | 8/1973 | Kobayashi et al. | 430/29 |

*Primary Examiner*—Won H. Louie, Jr.
*Attorney, Agent, or Firm*—Charles E. Pfund

[57] ABSTRACT

A photosensitive film applied onto the inner surface of a faceplate of color picture tube is exposed to light through a shadow mask. The exposed portions of the photosensitive film are further hardened by the photo-cross linking property until they exhibit hydrophobic property. Since these further hardened portions repel a light absorbing material, for example graphite, the graphite adheres to only the portions of the faceplate between the exposed portions. The surplus light absorbing material deposited on the further hardened portions is removed by development, whereby a black matrix surface can be obtained having a pattern of the light absorbing material adhered to the faceplate.

3 Claims, 6 Drawing Figures

METHOD OF FORMING FLUORESCENT SCREENS OF COLOR PICTURE TUBES

BACKGROUND OF THE INVENTION

This invention relates to a method of forming a fluorescent screen of a color picture tube, more particularly a mosaic or stripe shaped pattern of light absorbing material, that is, a pattern of so-called black matrix surface.

As disclosed in Japanese patent publication No. 218/1971 corresponding to U.S. Pat. No. 3,558,310 of RCA, according to a prior art method of forming a black matrix surface pattern, a photosensitive film is forced on the inner surface of a faceplate of a color picture tube, the photosensitive film is exposed to light through a shadow mask, the film is developed to remove unexposed portions to thereby form a desired pattern, a suspension of such a light absorbing material as graphite is coated on the remaining exposed portions and portions of the inner surface of the faceplate corresponding to unexposed portions, the pattern is then treated with such an etchant as an aqueous solution of hydrogen peroxide or sodium hypochlorite to swell and make brittle the photosensitive material which has been hardened by light exposure, and finally the photosensitve material which became brittle is peeled off together with the light absorbing material thereon by developing, for example, washing with water, thus forming a black matrix surface having a pattern of the light absorbing material coated on the inner surface of the faceplate. There has also been available a method utilizing a positive type photosensitive material whose light-exposed portions can be removed by developing or a method wherein a number of triads of phosphors are applied to predetermined positions prior to the formation of the light absorbing pattern, and a photosensitive material which is rendered, by light exposure, insoluble to water is coated along with a light absorbing material onto portions where the triads are absent and then exposed to light from the front of the faceplate to form a pattern of light absorbing material.

These methods, however, accompany various problems when forming the black matrix surface. More particularly, the method disclosed in Japanese patent publication No. 218/1971 requires a long processing time and moreover, the size of the openings formed by removal of the exposed portions of the photosensitive film tends to become larger than the size of the exposed images of the exposed portions owing to the etching treatment. Moreover, the etchant corrodes such mechanical devices as a suspension coating machine. Positive type photosensitive material is not only expensive but also dangerous because it requires an organic solvent in use. According to the front exposure method, the configuration of the openings of the pattern where the light absorbing material is to be applied is affected by the granular contour of the phosphor layer previously formed so that the contour of the openings becomes extremely irregular, thus making it difficult to obtain clear picture images.

SUMMARY OF THE INVENTION

Accordingly, it is an object of this invention to provide a method of forming a fluorescent screen of a color picture tube which need not swell and make brittle a film of photosensitive material by etching for its removal, thus being capable of economically preparing a black matrix surface.

According to this invention, this object can be accomplished by providing a method of forming a black matrix surface on a fluorescent screen of a color picture tube comprising the steps of:

coating a light hardenable photosensitive material on the inner surface of a faceplate of the tube to form a photosensitive film;

exposing to light the photosensitive film through a shadow mask;

developing exposed portions of the photosensitive film;

further hardening the exposed portions of the photosensitive film remaining after development until they exhibit hydrophobic property;

applying a light absorbing material onto the entire surface of the faceplate and then drying the light absorbing material, thereby causing the light absorbing material to adhere to the portions of the faceplate between the further hardened portions; and developing the light absorbing material for removing portions thereof deposited on the further hardened portions.

DESCRIPTION OF THE PREFERRED EMBODIMENT

Figure 1:
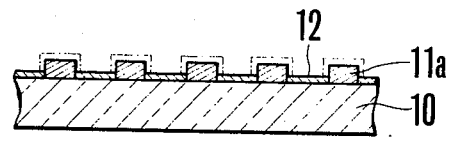
FIG. 1 is a sectional view showing a portion of a black matrix surface prepared by a prior art method.

As shown in FIG. 1, according to a prior art method of manufacturing a black matrix type fluorescent screen of a color picture tube, a light absorbing material 12 was coated on the entire inner surface of a faceplate 10 of the tube, in other words, not only on portions between exposed portions 11a of a photosensitive film but also on the tops of the exposed portions 11a (as depicted by dot and dash lines) and then the light exposed portions were etched off to obtain a black matrix surface having a pattern constituted by the light absorbing material 12 between the exposed portions. In contrast, according to the method of this invention, since the light absorbing material shown by the dot and dash lines is not coated, it is possible to obtain a black matrix type fluorescent screen having a desired pattern without the necessity of removing the exposed portions 11a during the steps of manufacturing the black matrix surface, such exposed portions being removed by a later baking step.

The method of this invention will now be described with reference to FIGS. 2A through 2E.

Figure 2A:
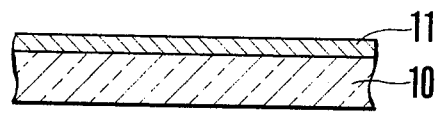
FIGS. 2A through 2E are sectional views showing successive steps of manufacturing the fluorescent screen of a color picture tube according to the method of this invention.
Figure 2B:
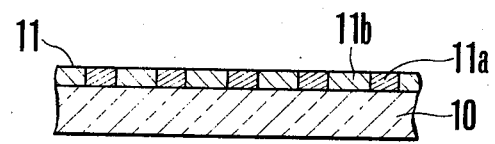
Figure 2C:
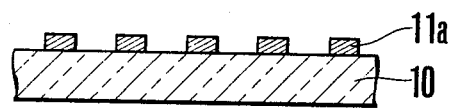

At first, as shown in FIG. 2A, a photosensitive film 11 of light hardenable type is coated on the inner surface of a faceplate 10, and the film 11 is then exposed to light through a shadow mask, not shown, to form exposed and hardened portions 11a and unexposed portions 11b in the film 11, as shown in FIG. 2B. The film 11 is then developed as by washing with water to remove the unexposed porions 11b, thus forming a desired pattern of the photosensitive material comprising only the exposed portions 11a, as shown in FIG. 2C.

Figure 2D:
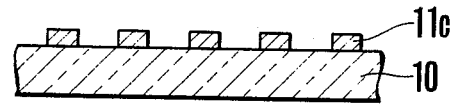
Figure 2E:
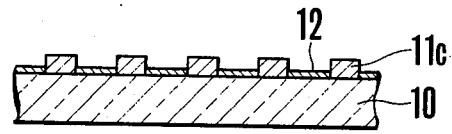

The pattern thus formed does not dissolve in water but tends to swell by absorbing water. According to the invention, the pattern of the exposed portions 11a is treated with such an aqueous solution of tannic acid, boric acid or alum, or with such an astringent agent as an aqueous solution of ferric sulfate or ammonium sulfate and then dried to obtain exposed portions 11c which have been further hardened until they exhibit hydrophobic property, as shown in FIG. 2D. According to a modified method of this step the exposed portions 11a are treated with such a substance having photo-cross linking property as an aqueous solution of ammonium bichromate, diazonium salts, or azide compounds, and then the entire inner surface of the faceplate is exposed to light further harden the exposed portions 11a. According to an alternative method, the pattern of the photosensitive material comprising the exposed portions 11a is treated with such a substance as formalin, acetoaldehyde, or gurtaraldehyde to further harden the pattern, thereby rendering the same hydrophobic. Thereafter, the pattern is dried.

The exposed portions 11c thus further hardened exhibit a property to repel a suspension of a light absorbing substance, for example, graphite which is to be coated on the inner surface of the panel. In other words, the graphite suspension cannot penetrate into further hardened exposed portions 11c and hence graphite cannot be adhered thereto. The "hydrophobic property" herein means a property which the exposed portions 11c exhibit as a result of the further hardening. Thus, after the step shown in FIG. 2D, when a suspension of graphite is coated on the entire inner surface of the faceplate and then dried, the graphite 12 in the suspension will adhere only on the exposed glass portions of the inner surface of the faceplate. Although surplus graphite also deposits on the further hardened exposed portions 11c, such graphite can be removed readily by development (washing) after drying, with the result that graphite will remain only on the exposed glass portions, thereby forming a pattern consisting of the light absorbing material 12.

To have better understanding of the present invention, the following examples are given but it should be understood that the invention is not limited to these specific examples.

EXAMPLE 1

After coating and drying a film 11 of the negative type photosensitive material on the inner surface of the faceplate 10, the film 11 was sequentially exposed through a shadow mask to light emanated by a light source, for example a source of ultraviolet rays, not shown, which positioned at a position corresponding to the deflection center of electron beams of respective colors. Then the film 11 was developed with warm water. Then, 5% aqueous solution of ammonium sulfate was sprayed onto the exposed portions of the photosensitive material remaining after development. Thereafter, the photosensitive material was heat treated at a temperature of about 70° C. to cause it to further harden. Thereafter, a 5% graphite suspension was coated on the entired inner surface of the faceplate and then dried. Next, the surface was washed by spraying pure warm water so as to remove only graphite deposited on the further hardened portions of the photosensitive material, thereby obtaining a matrix pattern. Then, three color phosphors were applied in a manner well known in the art.

EXAMPLE 2

The aqueous solution of ammonium sulfate utilized in Example 1 was substituted by 5% aqueous solution of ammonium bichromate. After drying, the entire inner surface of the faceplate was exposed to light. Then, the exposed portions of the photosensitive material was heat treated at a temperature of about 70° C. to sufficiently harden the exposed portions. A matrix pattern was obtained by the same succeeding steps as in Example 1.

EXAMPLE 3

The aqueous solution of ammonium sulfate utilized in Example 1 was substituted by 3% aqueous solution of formaldehyde. After drying, the entire inner surface of the faceplate was exposed to light. Then, the exposed portions of the photosensitive material was heat treated at a temperature of about 70° C. to sufficiently harden the exposed portions. A matrix pattern was formed by the same succeeding steps as in Example 1.

As described above, according to the method of manufacturing a fluorescent screen of a color picture tube of this invention, the etching step for peeling off light-exposed portions of the photosensitive material by swelling and making brittle the same becomes unnecessary, thus simplifying the process steps and decreasing the manufacturing cost. Moreover, various defects caused by the etching treatment can be eliminated since it is possible to form accurate openings of the same shape as the exposed images, thus improving the quality.

What is claimed is:

1. A method of forming a black matrix surface on a fluorescent screen of a color picture tube comprising the steps of:
   coating a light hardenable photosensitive material on the inner surface of a glass faceplate of said tube to form a photosensitive film;
   exposing to light said photosensitive film through a shadow mask;
   developing exposed portions of said photosensitive film to remove the unexposed portions;
   applying a photo-crosslinkable material to the developed portions of said faceplate;
   further hardening by photo-cross linking the exposed portions of said photosensitive film remaining after development by light exposure of said faceplate and subsequent hardening of the exposed portions after application of said photocrosslinkable material until they exhibit hydrophobic property sufficient to prevent penetration and adhesion of a light absorbing material such as graphite;
   applying a light absorbing material such as graphite onto the entire inner surface of said faceplate and then drying the light absorbing material, thereby causing said light absorbing material to be deposited on said further hardened exposed portions and adhere only to the portions of said faceplate between said further hardened portions; and
   developing the light absorbing material for removing portions thereof deposited on said further hardened portions.

2. A method as defined in claim 1 wherein the step of forming the further hardened portions comprises the steps of spraying a 5% aqueous solution of ammonium bichromate onto said exposed portions, drying the exposed portions, again exposing to light the dried, exposed portions, and then heat treating said portions at a temperature of about 70° C.

3. A method as defined in claim 1 wherein said step of forming the further hardened portions comprises the steps of spraying a 3% aqueous solution of formaldehyde onto said exposed portions, drying the exposed portions, again exposing to light dried and exposed portions, and then heat treating said exposed portions at a temperature of about 70° C.

* * * * *